(12) United States Patent
Kobayashi

(10) Patent No.: US 8,462,885 B2
(45) Date of Patent: Jun. 11, 2013

(54) PHASE-LOCKED LOOP CIRCUIT

(75) Inventor: Yuka Kobayashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 223 days.

(21) Appl. No.: 13/036,547

(22) Filed: Feb. 28, 2011

(65) Prior Publication Data

US 2012/0063546 A1 Mar. 15, 2012

(30) Foreign Application Priority Data

Sep. 13, 2010 (JP) ................................. 2010-204476

(51) Int. Cl.
*H03K 9/00* (2006.01)

(52) U.S. Cl.
USPC ............................... 375/316; 331/17; 331/179

(58) Field of Classification Search
USPC ....................... 331/10, 17; 375/316, 374, 376
See application file for complete search history.

(56) References Cited

U.S. PATENT DOCUMENTS 5,987,085 A * 11/1999 Anderson ...................... 375/374
2009/0033429 A1* 2/2009 Song ................................ 331/17

OTHER PUBLICATIONS

Gao, et al., "A Low Noise Sub-Sampling PLL in Which Divider Noise is Eliminated and PD/CP Noise is Not Multiplied by $N^2$", IEEE Journal of Solid-State Circuits, vol. 44, No. 12, pp. 3253-3263, (Dec. 2009).

* cited by examiner

*Primary Examiner* — Leon-Viet Nguyen
(74) *Attorney, Agent, or Firm* — Finnegan, Henderson, Farabow, Garrett & Dunner, L.L.P.

(57) ABSTRACT

A voltage-controlled oscillator generates a first signal and a second signal having a phase reverse to that of the first signal. A switch supplies a current signal generated by a first charge pump to a loop filter. A counter counts a cycle number of the second signal included in one cycle period of a reference signal. A second charge pump supplies, to the loop filter, a first current signal having a constant value and a second current signal having a constant value whose polarity is reverse to that of the first current signal. The control circuit controls the switch and the second charge pump based on a comparison between the cycle number of the second signal counted by the counter and a value X.

5 Claims, 14 Drawing Sheets

| | | | | |
|---|---|---|---|---|
| DFF OUTPUT OF FIRST SIGNAL | 0 | 0 | 1 | 1 |
| DFF OUTPUT OF SECOND SIGNAL | 1 | 1 | 0 | 0 |
| DFF OUTPUT OF THIRD SIGNAL | 1 | 0 | 0 | 1 |
| DFF OUTPUT OF FOURTH SIGNAL | 0 | 1 | 1 | 0 | ns 1

PHASE-LOCKED LOOP CIRCUIT

CROSS REFERENCE TO RELATED APPLICATIONS

This application is based upon and claims the benefit of priority from the prior Japanese Patent Application No. 2010-204476, filed on Sep. 13, 2010, the entire contents of which are incorporated herein by reference.

FIELD

The embodiments of the present invention relate to a PLL (Phase-Locked Loop) circuit.

BACKGROUND

Conventionally, there is known a sub-sampling PLL method in which a frequency divider is not used. In this method, a phase comparator sub-samples the output of a voltage-controlled oscillator (VCO) directly with a reference signal in order to achieve phase synchronization. Converting the phase difference between the reference signal and the VCO output directly into a voltage in this way leads to the advantage that high gain can be realized while restraining in-band PLL noise.

However, in the phase difference-current characteristics in the above method, positive and negative are reversed in the cycle of 2π. Accordingly, negative current is outputted when the phase difference shows that positive current should be outputted (when the phase is delayed, for example) or positive current is outputted when the phase difference shows that negative current should be outputted (when the phase is advanced, for example). In this case, a cycle slip phenomenon occurs and longer lockup time is required.

DETAILED DESCRIPTION

Figure 1:
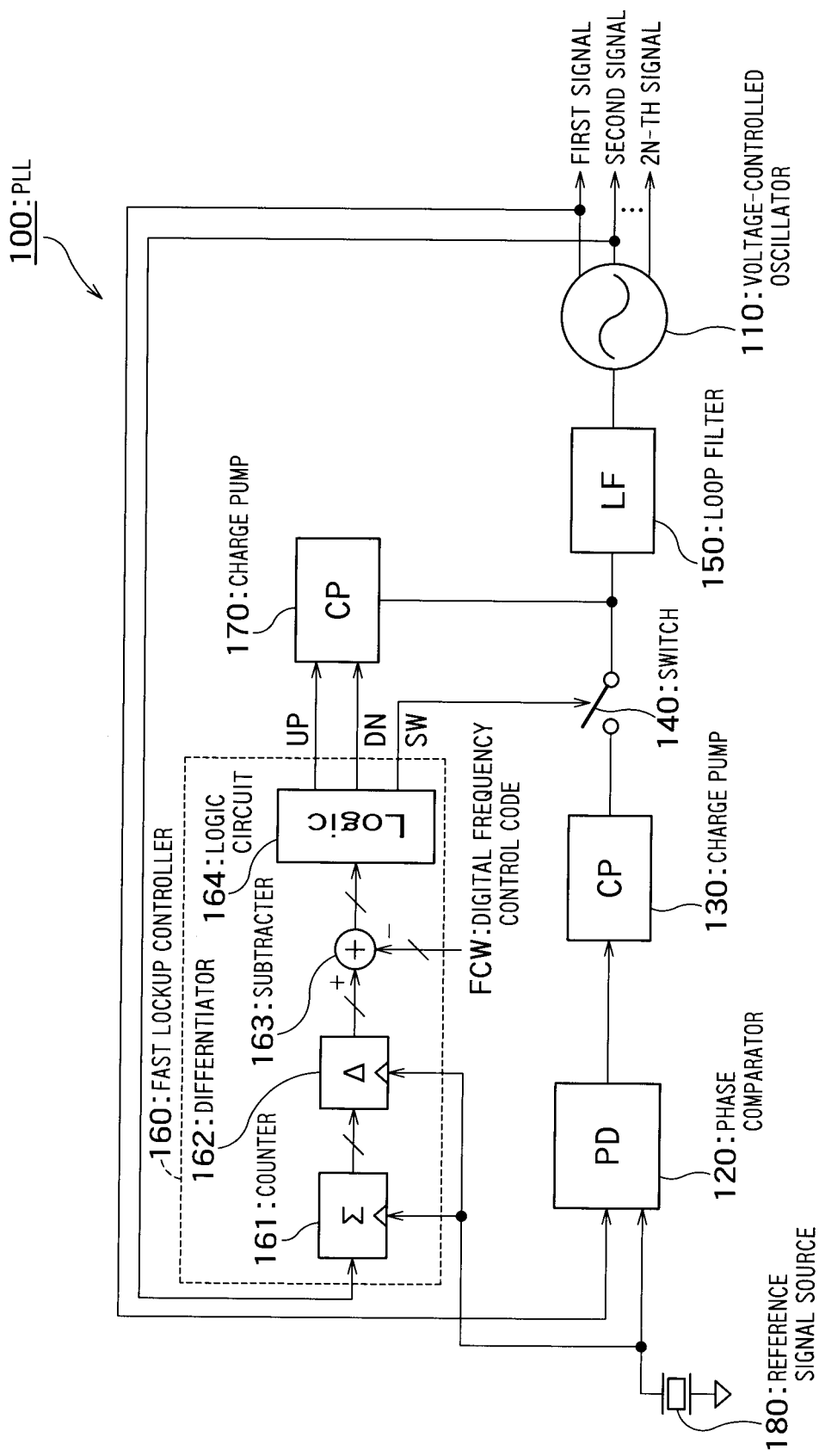
FIG. 1 shows the structure of a phase-locked loop circuit according to a first embodiment.

According to one embodiment of the present invention, there is provided a phase-locked loop circuit for obtaining an output signal having an output frequency obtained by multiplying a frequency of a reference signal by an arbitrary integer X of 1 or greater and having a phase synchronized with that of the reference signal.

The phase-locked circuit includes a reference signal source, a voltage-controlled oscillator, a phase comparator, a first charge pump, a loop filter, a switch, a counter, a second charge pump and a control circuit.

The reference signal source generates the reference signal.

The voltage-controlled oscillator generates a first signal and a second signal having a phase reverse to that of the first signal, frequencies of the first signal and the second signal being controlled depending on a control voltage.

The phase comparator acquires a first sampled voltage by sampling a voltage of the first signal in each cycle of the reference signal.

The first charge pump generates a current signal depending on the sampled voltage.

The loop filter generates the control voltage to be supplied to the voltage-controlled oscillator by smoothing the current signal.

The switch has an ON state and an OFF state and supplies the current signal generated by the first charge pump to the loop filter in the ON state and to block the supply of the current signal to the loop filter in the OFF state.

The counter counts a cycle number of the second signal included in one cycle period of the reference signal.

The second charge pump supplies, to the loop filter, a first current signal having a constant value and a second current signal having a constant value whose polarity is reverse to that of the first current signal, and selectively has any one of a first state for supplying only the first current signal, a second state for supplying only the second current signal, and a third state for not supplying either of the first current signal and the second current signal.

The control circuit controls the switch and the second charge pump based on a comparison between the cycle number of the second signal counted by the counter and the value X.

Hereinafter, the embodiments will be explained in detail referring to the drawings.

First Embodiment

FIG. 1 shows the structure of a phase-locked loop circuit (PLL) according to a first embodiment.

This phase-locked loop circuit is provided to obtain an output signal having an output frequency obtained by multiplying the frequency of a reference signal by an arbitrary integer X of 1 or greater while having a phase synchronized with that of the reference signal.

In FIG. 1, a PLL 100 includes: a voltage-controlled oscillator 110; a phase comparator (PD) 120; a charge pump (CP)

130; a switch 140; a loop filter 150 (LF) 150; a fast lockup controller (control circuit) 160; a charge pump 170; and a reference signal source 180.

The reference signal source 180 generates a reference signal having a predetermined frequency. The reference signal source 180 outputs the generated reference signal to the phase comparator 120 and the fast lockup controller 160.

The voltage-controlled oscillator 110 generates and outputs 2×N multiphase signals each having a frequency controlled depending on the control voltage supplied to the voltage-controlled oscillator 110. The control voltage is supplied by the loop filter 150. N is an arbitrary integer of 1 or greater.

In the present embodiment, N is 1, and the voltage-controlled oscillator 110 generates two phase signals. That is, the voltage-controlled oscillator 110 generates a first signal and a second signal having a phase delayed from that of the first signal by π. The phase of the first signal and that of the second signal are reverse to each other. The first signal is inputted into the phase comparator 120 while the second signal is inputted into the fast lockup controller 160. Each of the first and second signals may have a square wave pattern or a sine wave pattern.

The voltage-controlled oscillator 110 may be freely designed as long as it can generate 2×N multiphase signals. For example, the voltage-controlled oscillator 110 may be formed of differential amplifiers arranged in N stages.

In the present embodiment, the voltage-controlled oscillator 110 generates multiphase signals each having a higher frequency as the value of the control voltage becomes larger, and generates multiphase signals each having a lower frequency as the value of the control voltage becomes smaller. Note that the operation may be performed in a reverse way.

At least one of the first signal and second signal generated by the voltage-controlled oscillator 110 is outputted as an output signal. For example, the first signal is used as an operation clock by the following circuit (not shown).

The phase comparator 120 directly converts a phase difference Δϕ between the reference signal generated by the reference signal source 180 and the first signal inputted from the voltage-controlled oscillator 110 into a voltage. That is, the phase comparator 120 samples the voltage of the first signal in each cycle of the reference signal. In the present embodiment, the sampling is performed at the rising edge of the reference signal. Note that not only the first signal but also the second signal may be sampled, which will be explained later in a third embodiment.

Here, the phase difference Δϕ is obtained by viewing the phase of the first signal ($f_{vco}$) from the phase of the reference signal ($f_{ref}$), which is defined as $\Delta\phi=f_{ref}-f_{vco}$. When Δϕ is negative, the phase of the first signal is advanced from that of the reference signal, and when Δϕ is positive, the phase of the first signal is delayed from that of the reference signal.

Note that this definition is merely an example, and thus the phase difference may be defined in a reverse way. That is, the phase difference may be defined by viewing the phase of the reference signal from the phase of the first signal.

The charge pump (first charge pump) 130 generates a current signal depending on the sampled voltage detected by the phase comparator 120.

Figure 2:
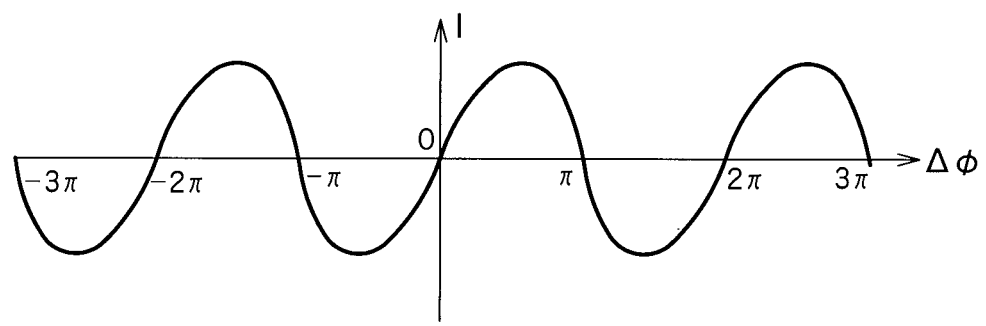
FIG. 2 shows an example of phase difference-current characteristics of a charge pump arranged behind a phase comparator.

FIG. 2 shows an example of phase difference-current characteristics of the phase comparator 120. The horizontal axis shows phase difference, and the vertical axis shows current.

Since the phase comparator 120 performs only phase comparison (cannot perform frequency comparison), a cycle of 2π is characteristically achieved as shown in FIG. 2. Accordingly, when the phase difference becomes greater than π, negative current is outputted even when positive current should be outputted. To the contrary, when the phase difference becomes smaller than −π, positive current is outputted even when negative current should be outputted.

In the present embodiment, by employing the fast lockup controller 160 and the charge pump 170, positive current is constantly outputted when the phase of the first signal lags that of the reference signal, and negative current is constantly outputted when the phase of the first signal leads that of the reference signal. Based on this characteristic, fast lockup can be realized.

The switch 140 switches the electrical connection between the charge pump 130 and the loop filter 150. ON and OFF of the switch 140 are controlled by an SW signal from the fast lockup controller 160.

In the initial state, the switch 140 is ON, and the current signal generated by the charge pump 130 is supplied to the loop filter 150 through the switch 140.

The loop filter 150 smoothes the supplied current signal to generate a control voltage to be supplied to the voltage-controlled oscillator 110. The loop filter 150 smoothes the current signal supplied from the charge pump 130 when the switch 140 is ON, and smoothes the current signal supplied from the charge pump 170 when the switch 140 is OFF.

The fast lockup controller 160 includes: a counter 161; a differentiator 162; a subtracter 163; and a logic circuit 164.

The counter 161 counts the number of rising edges (see FIG. 4, which will be explained later) of the second signal inputted from the voltage-controlled oscillator 110. The counter 161 includes a register for temporarily storing the count value.

The counter 161 increments the value of the register by 1 each time the rising edge of the second signal is inputted. When the rising edge of the reference signal is inputted, the counter 161 outputs the count value currently stored in the register. That is, the counter 161 outputs the value in the register in each cycle of the reference signal.

The differentiator 162 reads the counter value outputted from the counter 161 at each rising edge of the reference signal (in each cycle of the reference signal), and subtracts the previously read counter value from the currently read counter value.

In this way, the differentiator 162 calculates the number of rising edges (cycles) A of the second signal included in one cycle period of the reference signal (see FIG. 4, which will be explained later).

The differentiator 162 outputs the cycle number A to the subtracter 163. The differentiator 162 includes a register for temporarily storing the read value.

The subtracter 163 reads a digital frequency control code FCW specifying the value X (showing that the output signal is required to have a frequency X times greater than the reference frequency) from a storage (register etc.) (not shown).

For example, when the output signal having a frequency 2 times greater than that of the reference signal is required to be synchronized with the phase of the reference signal, X is set as 2. In the example shown in the present embodiment, X is 2.

The digital frequency control code FCW stored in the storage may be rewritten by a rewriting unit.

The subtracter 163 receives, from the differentiator 162, the output A (the number of rising edges (cycles) of the second signal included in one cycle period of the reference signal), and obtains a differential value B by subtracting the value of the digital frequency control code FCW (=2) from the cycle number A (B=A−X). The subtracter 163 supplies the differential (output) value B to the logic circuit 164.

The logic circuit 164 judges, based on the differential value B, which one of the following intervals includes the phase difference $\Delta\phi$ between the reference signal and the first signal: an interval in which the phase difference $\Delta\phi$ is equal to or greater than $-\pi$ and equal to or smaller than $\pi$ ($-\pi\leq\Delta\phi\leq\pi$); an interval in which the phase difference $\Delta\phi$ is smaller than $-\pi$ ($\Delta\phi<-\pi$); and an interval in which the phase difference $\Delta\phi$ is greater than $\pi$ ($\Delta\phi>\pi$). The logic circuit 164 controls the values of UP signal, DN signal, and SW signal depending on the judgment result.

When $\Delta\phi<-\pi$, the phase of the first signal leads that of the reference signal by a value which is greater than $\pi$. When $\Delta\phi>\pi$, the phase of the first signal lags the reference signal by a value which is greater than $\pi$. When $-\pi\leq\Delta\phi\leq\pi$, the phase of the first signal leads or lags the phase of the reference signal by a value which is equal to or greater than $-\pi$ and equal to or smaller than $\pi$.

Here, the UP signal and the DN signal are signals for instructing the charge pump 170 to generate current. The SW signal is a signal for instructing the charge pump 170 to turn the switch 140 OFF or ON.

In more detail, the UP signal is an instruction for generating an up current signal (passing constant current through the loop filter). In this example, the up current signal is positive constant current if the current when the phase difference $\Delta\phi$ is 0 is defined as 0 in FIG. 2.

The DN signal is an instruction for generating a down current signal (extracting charge from the loop filter with constant current). In this example, the down current signal is negative constant current if the current when the phase difference $\Delta\phi$ is 0 is defined as 0 in FIG. 2. The down current signal has a polarity reverse to the up current signal.

The up current signal corresponds to a first current signal, and the down current signal corresponds to a second current signal. Depending on the configuration of the voltage-controlled oscillator 110 and the loop filter 150, the down current signal may correspond to the first current signal and the up current signal may correspond to the second current signal. This corresponds to a case where the oscillation frequency of the voltage-controlled oscillator 110 becomes lower as the current signal to be outputted becomes greater, and the oscillation frequency becomes higher as the current signal to be outputted becomes smaller, for example.

The UP signal and the DN signal have high level ("1") state and low level ("0") state respectively. In this example, "1" shows "valid," and "0" shows "invalid."

When the UP signal is "1" and the DN signal is "0," the charge pump (second charge pump) 170 generates the up current signal and supplies the generated up current signal to the loop filter 150 (first state).

When the UP signal is "0" and the DN signal is "1," the charge pump 170 generates the down current signal and supplies the generated down current signal to the loop filter 150 (second state).

When both of the UP signal and the DN signal are "0," the charge pump 170 does not generate any current signal (third state).

As stated above, the charge pump 170 selectively has any one of the first state for supplying the up current signal, the second state for supplying the down current signal, and the third state for not supplying either of the up current signal and the down current signal.

Fundamentally, the logic circuit 164 detects, based on the differential value B, the change in the phase difference $\Delta\phi$ from a value which is larger than $-\pi$ to a value which is smaller than $-\pi$, from a value which is smaller than $-\pi$ to a value which is larger than $-\pi$, from a value which is smaller than $\pi$ to a value which is larger than $\pi$, or from a value which is larger than $\pi$ to a value which is smaller than $\pi$. Then, the logic circuit 164 controls the DN signal, the UP signal, and the SW signal depending on this detection.

When the phase difference $\Delta\phi$ is $-\pi\leq\Delta\phi\leq\pi$, the logic circuit 164 performs control so that the DN signal is 0, the UP signal is 0, and the SW signal is ON (third state).

When the phase difference is $\Delta\phi<-\pi$, the logic circuit 164 performs control so that the DN signal is 1, the UP signal is 0, and the SW signal is OFF (second state).

When phase difference is $\Delta\phi>-\pi$, the logic circuit 164 performs control so that the DN signal is 0, the UP signal is 1, and the SW signal is OFF (first state).

Therefore, when the UP signal and the DN signal are 0 and the SW signal is ON (third state), output current of the charge pump 130 is supplied to the loop filter 150.

When the DN signal is 1, the UP signal is 0, and the SW signal is OFF (second state), the down current signal is supplied to the loop filter 150.

When the UP signal is 1, the DN signal is 0, and the SW signal is OFF (first state), the up current signal is supplied to the loop filter 150.

Figure 3:
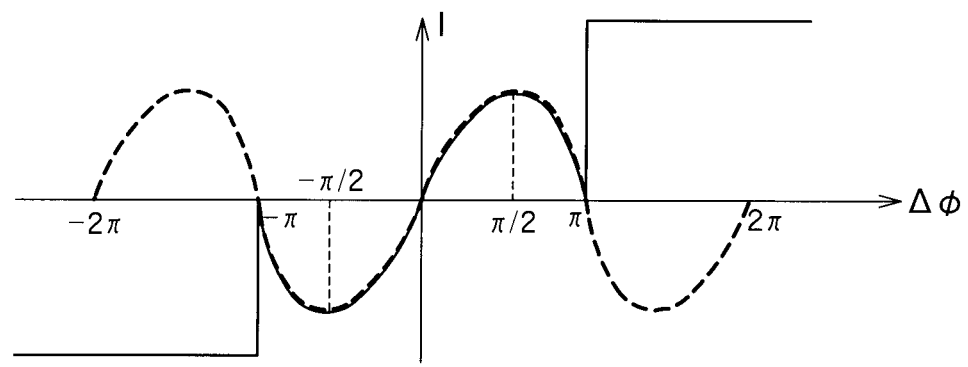
FIG. 3 shows phase difference-current characteristics realized in the first embodiment.

In this way, in the present embodiment, the phase difference—current characteristics as shown in FIG. 3 can be realized.

The broken line shows the characteristics of the phase comparator 120 shown in FIG. 2. The solid line shows the characteristics realized by the present embodiment.

In the present embodiment, when the phase difference is greater than $\pi$, a positive current signal is constantly generated. Similarly, when the phase difference is smaller than $\pi$, a negative current signal is constantly generated. Accordingly, fast lockup can be realized.

Figure 4:
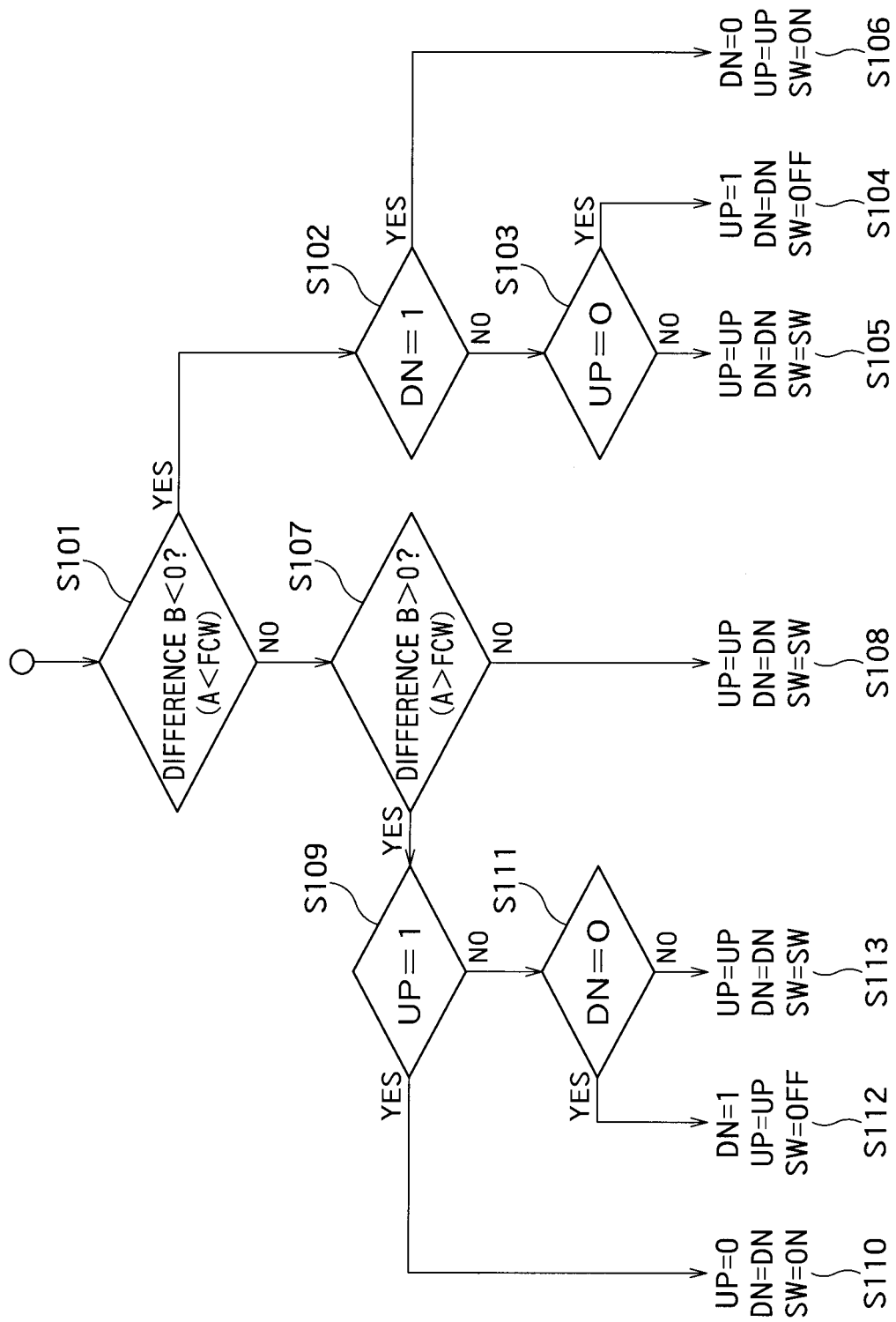
FIG. 4 is a flow chart showing a detailed operation of a logic circuit according to the first embodiment.

FIG. 4 is a flow chart showing the operation of the logic circuit 164 in detail.

The logic circuit 164 is inputted with the differential value B from the subtracter 163 and examines whether the differential value B is negative (the cycle number A<FCW) (S101).

When the differential value B is negative, the logic circuit 164 examines whether the DN signal is 1 (S102).

When the DN signal is not 1, the logic circuit 164 examines whether the UP signal is 0 (S103).

When the UP signal is 0, the UP signal is set 1, the DN signal is set at the present value (=0), and the SW signal for the switch 140 is set OFF (S104). That is, the charge pump 170 is controlled in the first state, and the switch 140 is controlled in OFF state.

Note that, in the drawing, the expression of "DN=DN" means that the value of the DN signal is kept at the present value (the value immediately before). the expression of "UP=UP" means that the value of the UP signal is kept at the present value. The expression of "SW=SW" means that the value of the SW signal is kept at the present value.

In step S103, when the UP signal is not 0, the UP signal is set at the present value (=1), the DN signal is also set at the present value (=0), and the SW signal is kept at the present value (=OFF) (S105). That is, the charge pump 170 is controlled in the first state, and the switch 140 is controlled in OFF state.

In step S102, when the DN signal is 1, the DN signal is set 0, the UP signal is set at the present value (=0), and the SW signal is set ON (S106). That is, the charge pump 170 is controlled in the third state, and the switch 140 is controlled in ON state.

In step S101, when the differential value B is judged not to be negative, whether the differential value B is positive (the cycle number A>FCW) is examined (S107).

When the differential value B is positive, whether the UP signal is 1 is examined (S109).

When the UP signal is 1, the UP signal is set 0, the DN signal is set at the present value (=0), and the SW signal is set ON (S110). That is, the charge pump 170 is controlled in the third state, and the switch 140 is controlled in ON state.

In step S109, when the UP signal is not 1, whether the DN signal is 0 is examined (S111).

When the DN signal is 0, the DN signal is set 1, the UP signal is set at the present value (=0), and the SW signal is set OFF (S112). That is, the charge pump 170 is controlled in the second state, and the switch 140 is controlled in OFF state.

When the DN signal is not 0, the UP signal is set at the present value (=0), the DN signal is also set at the present value (=1), and the SW signal is kept at the present value (=OFF) (S113). That is, the charge pump 170 is controlled in the second state, and the switch 140 is controlled in OFF state.

In step S107, when the differential value B is not positive, that is, when the differential value B is 0, the UP signal and the value of the DN signal are set at the present values, and the value of the SW signal is also set at the present value (S108).

That is, when the charge pump 170 is in the first state, the charge pump 170 is controlled in the first state, and the switch 140 is controlled in OFF state. When the charge pump 170 is in the second state, the charge pump 170 is controlled in the second state, and the switch 140 is controlled in OFF state. When the charge pump 170 is in the third state, charge pump 170 is controlled in the third state, and the switch 140 is controlled in ON state.

In the above operation, the UP signal and the DN signal do not become 1 at the same time, and thus malfunction of the charge pump 170 can be prevented.

In the above flow, steps S110 and S106 correspond to the case where the phase difference $\Delta\phi$ is judged as $-\pi \leq \Delta\phi \leq \pi$.

Steps S112 and S113 correspond to the case where the phase difference $\Delta\phi$ is judged as $\Delta\phi > \pi$.

Steps S104 and S105 correspond to the case where the phase difference $\Delta\phi$ is judged as $\Delta\phi < -\pi$.

Step S108 corresponds to the case where the phase difference $\Delta\phi$ is judged as belonging to the same interval as the previous interval.

Hereinafter, a concrete example of the operation of a fast lockup circuit will be shown.

Figure 5:
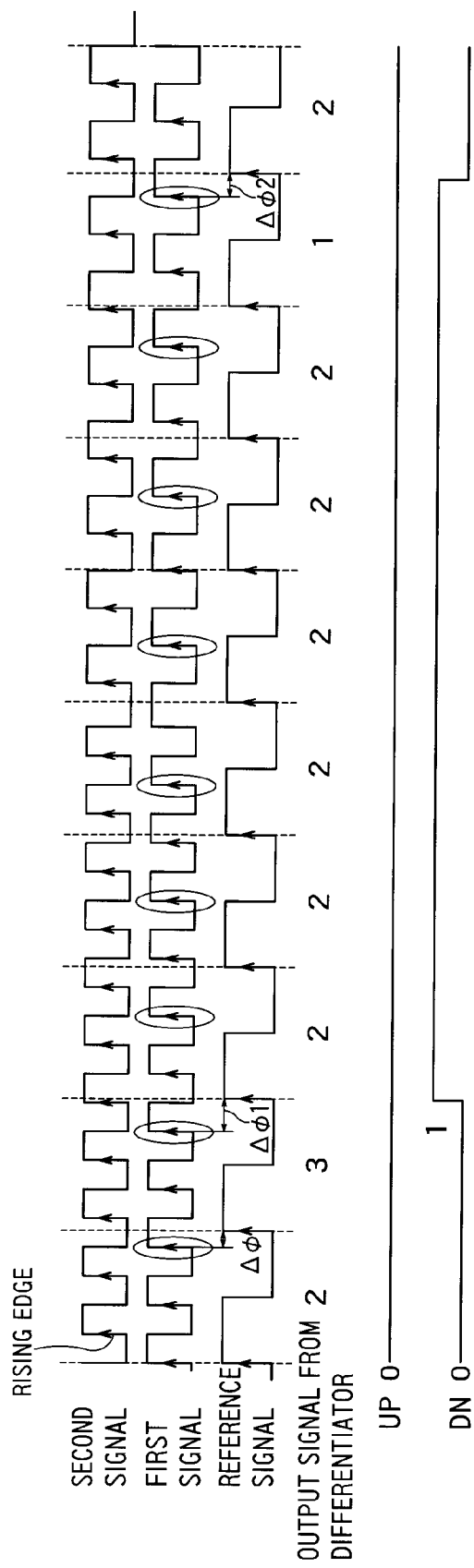
FIG. 5 shows an example of time charts of first signal, second signal, reference signal, differentiator output signal, UP signal, and DN signal.

FIG. 5 shows an example of time charts of the first signal, the second signal, the reference signal, the cycle number (differentiator output) A, the UP signal, and the DN signal when the value X of the digital frequency control code FCW is 2.

In the initial state, both of the UP signal and the DN are 0, and the switch 140 is turned ON.

As shown in FIG. 5, in the second cycle period, the phase difference $\Delta\phi$ between the reference signal and the first signal 1 becomes smaller than $-\pi$, and the cycle number A is changed from 2 to 3 (NO at S101, and YES at S107 in FIG. 4).

At present, the UP signal is 0 (NO at S109) and the DN signal is also 0 (YES at S111), and thus the DN signal is set 1 and the UP signal is set at the present value (=0) (S112). Further, the SW signal is set OFF (S112).

Accordingly, the switch 140 is turned OFF, and the charge pump 170 is inputted with the DN signal of high level. The charge pump 170 generates the down current signal to reduce the output frequency of the voltage-controlled oscillator 110, and supplies it to the loop filter 150. In other words, in the following third cycle period, the loop filter 150 is supplied with the down current signal.

Even when the switch is OFF, the charge pump 130 generates a current signal depending on the input from the phase comparator 120, but the generated current signal is blocked by the switch 140 not to be inputted into the loop filter 150.

The cycle number A in the third to eighth cycle periods is 2, which is equal to the value of the digital frequency control code FCW. Therefore, the differential value B is 0 (NO at S101 and NO at S107).

Accordingly, in the fourth to ninth cycle periods, the UP signal is kept 0, the DN signal is kept 1, and the SW signal is kept OFF (S108). That is, during the fourth to ninth cycle periods, the down current signal is supplied to the loop filter 150.

In the ninth cycle period, the cycle number A becomes 1 (the differential value B=−1) (YES at S101). This means that the phase difference $\Delta\phi2$ changes from a value which is smaller than $-\pi$ to a value which is equal to or greater than $-\pi$ (entry into the interval of $-\pi \leq \Delta\phi \leq \pi$. Since the value of the DN signal is 1 (YES at S102), the DN signal is set 0, and the UP signal is set at the present value (=0). Further, the SW signal is set ON (S106).

In this way, supply of the down current signal from the charge pump 170 to the loop filter 150 is stopped. Further, the switch 140 is turned ON, and the output from the charge pump 130 is supplied to the loop filter 150.

In the time chart example shown in FIG. 5, the phase difference $\Delta\phi$ changes before and after $-\pi$, and control is appropriate performed also when the phase difference $\Delta\phi$ changes before and after n in the same manner in accordance with the flow chart of FIG. 4.

As stated above, according to the present embodiment, a positive current signal is supplied to the loop filter by turning the switch 140 OFF when the phase difference $\Delta\phi$ is greater than $\pi$, and a negative current signal is supplied to the loop filter by turning the switch 140 OFF when the phase difference $\Delta\phi$ is smaller than $-\pi$.

Therefore, a negative current signal reducing the output frequency does not flow when the phase difference $\Delta\phi$ is positive, and a positive current signal increasing the output frequency does not flow when the phase difference $\Delta\phi$ is negative.

In this way, lockup time can be shortened while maintaining the noise resistance in the band of the sub-sampling PLL.

In the present embodiment, lockup is performed by using the first signal and the reference signal, and the fast lockup controller 160 counts the number of rising edges (cycles) included in the second signal in one cycle period of the reference signal.

As another technique, lockup may be performed by using the second signal and the reference signal. In this case, the fast lockup controller 160 counts the number of falling edges (cycles) of the first signal included in one cycle period of the reference signal.

When carrying out the present embodiment, the phases of the first signal and the second signal may be freely set as 0 and $\pi$ or $\pi$ and 0 respectively, as long as the phases are reverse to each other.

Second Embodiment

Figure 6:
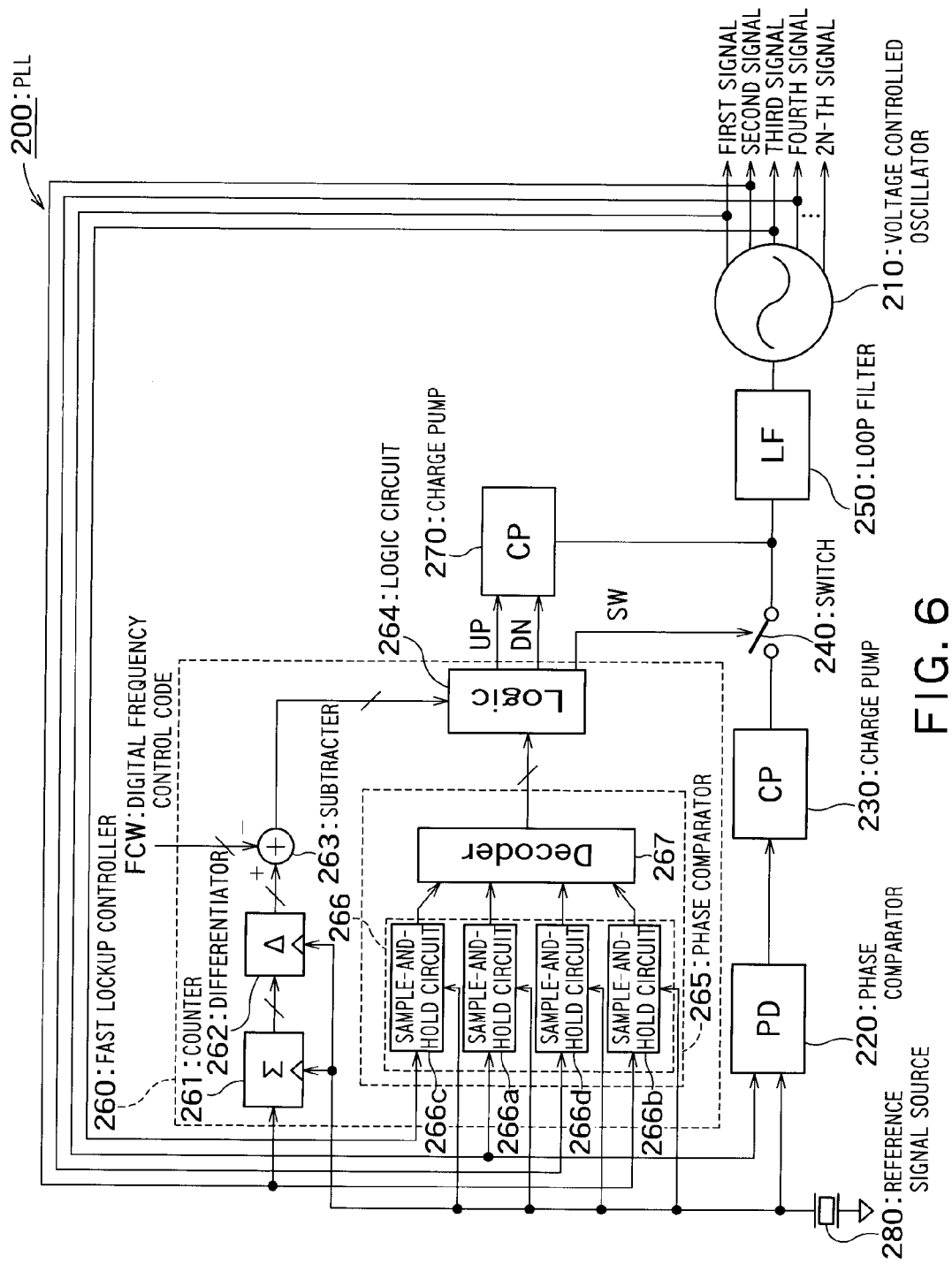
FIG. 6 shows the structure of a phase-locked loop circuit according to a second embodiment.

FIG. 6 shows the structure of a PLL 200 according to a second embodiment. Hereinafter, differences from the first embodiment will be mainly explained, and explanation overlapping with the first embodiment will be omitted.

The PLL 200 includes: a voltage-controlled oscillator 210; a phase comparator 220; a charge pump 230; a switch 240; a loop filter 250; a fast lockup controller 260; a charge pump 270; and a reference signal source 280.

The phase comparator 220, the charge pump 230, the switch 240, the loop filter 250, the charge pump 270, and the reference signal source 280 function similarly to the phase comparator 120, the charge pump 130, the switch 140, the loop filter 150, the charge pump 170, and the reference signal source 180 of the first embodiment, respectively.

Similarly to the first embodiment, the voltage-controlled oscillator 210 is formed of differential amplifiers arranged in N stages, and generates 2×N multiphase signals. In the present embodiment, N is 2, and first, second third, and fourth signal are generated. Each of the first to fourth signals may have a square wave pattern or a sine wave pattern.

The second signal is a differential signal of the first signal, and its phase lags that of the first signal by $\pi$. The third signal has a phase delayed from that of the first signal by $+\pi/2$. The fourth signal has a phase delayed from that of the second signal by $+\pi/2$.

In brief, when the phase of the first signal is defined as $0(0°)$, the phase of the second signal is $\pi(180°)$, the phase of the third signal is $\pi/2(90°)$, and the phase of the fourth signal is $3/2\pi(270°)$.

The fast lockup controller 260 includes: a counter 261; a differentiator 262, a subtracter 263, a logic circuit 264, and a phase comparator 265. The counter 261, the differentiator 262, and the subtracter 263 function to the counter 161, the differentiator 162, and the subtracter 163 of the first embodiment, respectively.

The phase comparator 265 includes sample-and-hold (S&H) circuits 266 (266a, 266b, 266c, and 266d) and a decoder 267.

The sample-and-hold circuit 266a is inputted with the first signal and the reference signal.

The sample-and-hold circuit 266b is inputted with the second signal and the reference signal.

The sample-and-hold circuit 266c is inputted with the third signal and the reference signal.

The sample-and-hold circuit 266d is inputted with the fourth signal and the reference signal.

The sample-and-hold circuits 266a to 266d sample the first signal, the second signal, the third signal, and the fourth signal respectively at each rising edge of the reference signal (in each cycle of the reference signal), and retain and output the sampled voltages.

The decoder 264 detects the phase relationship between the first signal and the reference signal with a resolution of $\pi/2$ by using the sampled voltages of the sample-and-hold circuits 266a to 266d. More concretely, the decoder 264 judges which one of the following four intervals includes the phase difference between the first signal and the reference signal.

$$-\pi \leq \Delta\phi < -\pi/2 \quad (1)$$

$$-\pi/2 \leq \Delta\phi < 0 \quad (2)$$

$$0 \leq \Delta\phi \leq \pi/2 \quad (3)$$

$$\pi/2 < \Delta\phi \leq \pi. \quad (4)$$

The decoder 264 outputs digital data showing the judgement result.

Concretely, the decoder 264 outputs digital data showing "1" in the case of interval (1), "2" in the case of interval (2), "3" in the case of interval (3), and "4" in the case of interval (4).

It is possible output the same digital data for intervals (2) and (3) by combining these intervals into one.

With respect to $-\pi/2$ in the intervals (1) and (2), the inequality sign in (1) may be replaced by an inequality sign with equality sign, and the inequality sign with equality sign in (2) may be replaced by an inequality sign. With respect to $\pi/2$ in the intervals (3) and (4), the inequality sign with equality sign on the right side in (3) may be replaced by an inequality sign, and the inequality sign with equality sign in (4) may be replaced by an inequality sign.

The interval (1) corresponds to a first interval of one embodiment, the interval (4) corresponds to a second interval, and intervals (2) and (3) correspond to a third interval of the one embodiment, for example.

Figure 7:
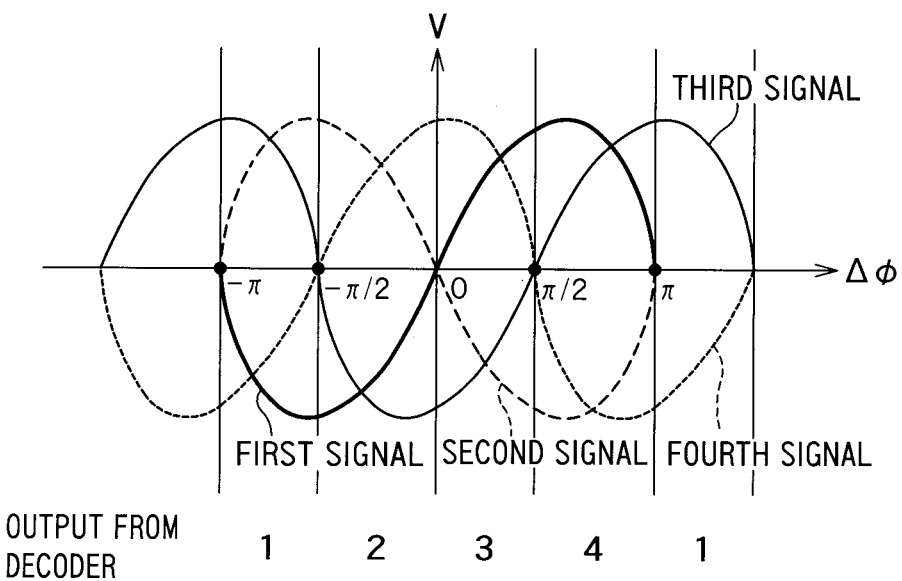
FIG. 7 shows the relationship among the phase difference between each signal and the reference signal, sampled voltage of each signal, and decoder output.

FIG. 7 shows the sampled voltages of the first signal, the second signal, the third signal, and the fourth signals and the output of the decoder 264 when the phase difference $\Delta\phi$ is generated between the reference signal and the first signal.

By using the sampled voltages of the first signal, the second signal, the third signal, and the fourth signal, the phase difference $\Delta\phi$ can be detected with a resolution of $\pi/2$ in the range of $-\pi \leq \Delta\phi \leq +\pi$.

Concretely, the interval (1) is detected when the sampled voltage of the first signal is equal to or smaller than the sampled voltage of the second signal and the sampled voltage of the third signal is greater than the sampled voltage of the fourth signal.

the interval (4) is detected when the sampled voltage of the first signal is equal to or greater than the sampled voltage of the second signal and the sampled voltage of the third signal is greater than the sampled voltage of the fourth signal.

The interval (2) is detected when the sampled voltage of the first signal is smaller than the sampled voltage of the second signal and the sampled voltage of the third signal is equal to or smaller than the sampled voltage of the fourth signal.

The interval (3) is detected when the sampled voltage of the first signal is equal to or greater than the sampled voltage of the second signal and the sampled voltage of the third signal is equal to or smaller than the sampled voltage of the fourth signal.

As another method, the categorization may be achieved by judging the voltage polarity of each signal.

For example, when the voltage of the first signal is negative or zero, the voltage of the fourth signal is negative, the voltage of the second signal is positive or zero, and the voltage of the third signal is positive, the interval (1) ($-\pi\Delta\phi<-\pi/2$) can be detected. The other intervals can be similarly detected.

Figure 8:
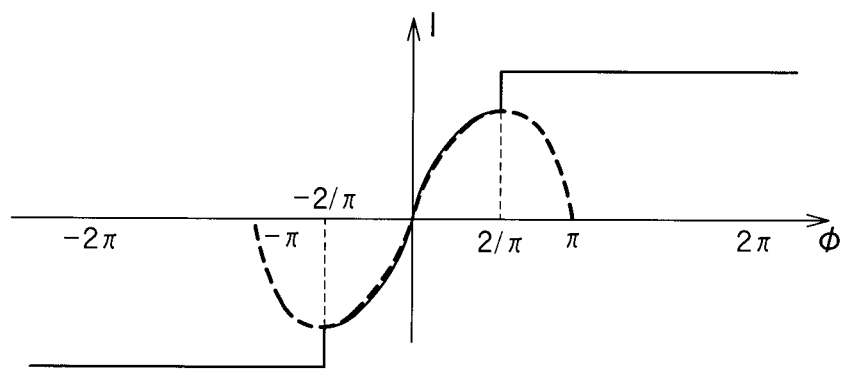
FIG. 8 shows phase difference-current characteristics realized in the second embodiment.

As stated above, by using the output of the decoder 264, it is possible judge whether the phase difference $\Delta\phi$ is greater than $\pi/2$ or smaller than $-\pi/2$ in the range of $-\pi \leq \Delta\phi \leq +\pi$. FIG. 8 shows phase difference—current characteristics realized by using this configuration. FIG. 8 will be explained in detail later.

The logic circuit 264 performs judgment based on the output of the decoder 267 and the differential value B outputted from the subtracter 263.

First, whether the phase difference $\Delta\phi$ is within the range of $-\pi \leq \Delta\phi \leq +\pi$ or within the range of $\Delta\phi<-\pi$ or $\Delta\phi>\pi$ is judge based on the differential value B of the subtracter 263. This can be realized by using the first embodiment.

When the phase difference $\Delta\phi$ is within the range of $\Delta\phi<-\pi$ or $\Delta\phi>\pi$, the DN signal, the UP signal, and the SW signal are generated by performing the processes similarly to the first embodiment. In this case, the process using the output of the decoder 267 is not performed.

On the other hand, when the phase difference $\Delta\phi$ is within the range of $-\pi \leq \Delta\phi \leq +\pi$, which one the above intervals (1) to (4) include the phase difference $\Delta\phi$ is judged based on the output of the decoder 267.

The interval (1) is determined when the output of the decoder 267 is "1," the interval (2) is determined when the output is "2," the interval (3) is determined when the output is "3," and the interval (4) is determined when the output is "4."

When determining the phase difference $\pi/2<\Delta\phi\leq\pi((4))$, the logic circuit 264 outputs the UP signal and turns the SW signal OFF. The charge pump 270 inputted with the UP signal generates the up current signal, and constant current is passed through the loop filter 250.

When determining $-\pi\leq\Delta\phi<-\pi/2((1))$, the logic circuit 264 outputs the DN signal and turns the SW signal OFF. The charge pump 270 inputted with the DN signal generates the down current signal, and charge is extracted from the loop filter 250 with constant current.

When determining $-\pi/2\leq\Delta\phi<0((2))$ or $0\leq\Delta\phi\pi/2((3))$, the logic circuit 264 performs a process similar to that performed in the first embodiment in the case of $-\pi\leq\Delta\phi\leq\pi$. That is, both of the DN signal and the UP signal are set 0, the SW signal is set ON, and the output current of the charge pump 230 is inputted into the loop filter 250.

Figure 9:
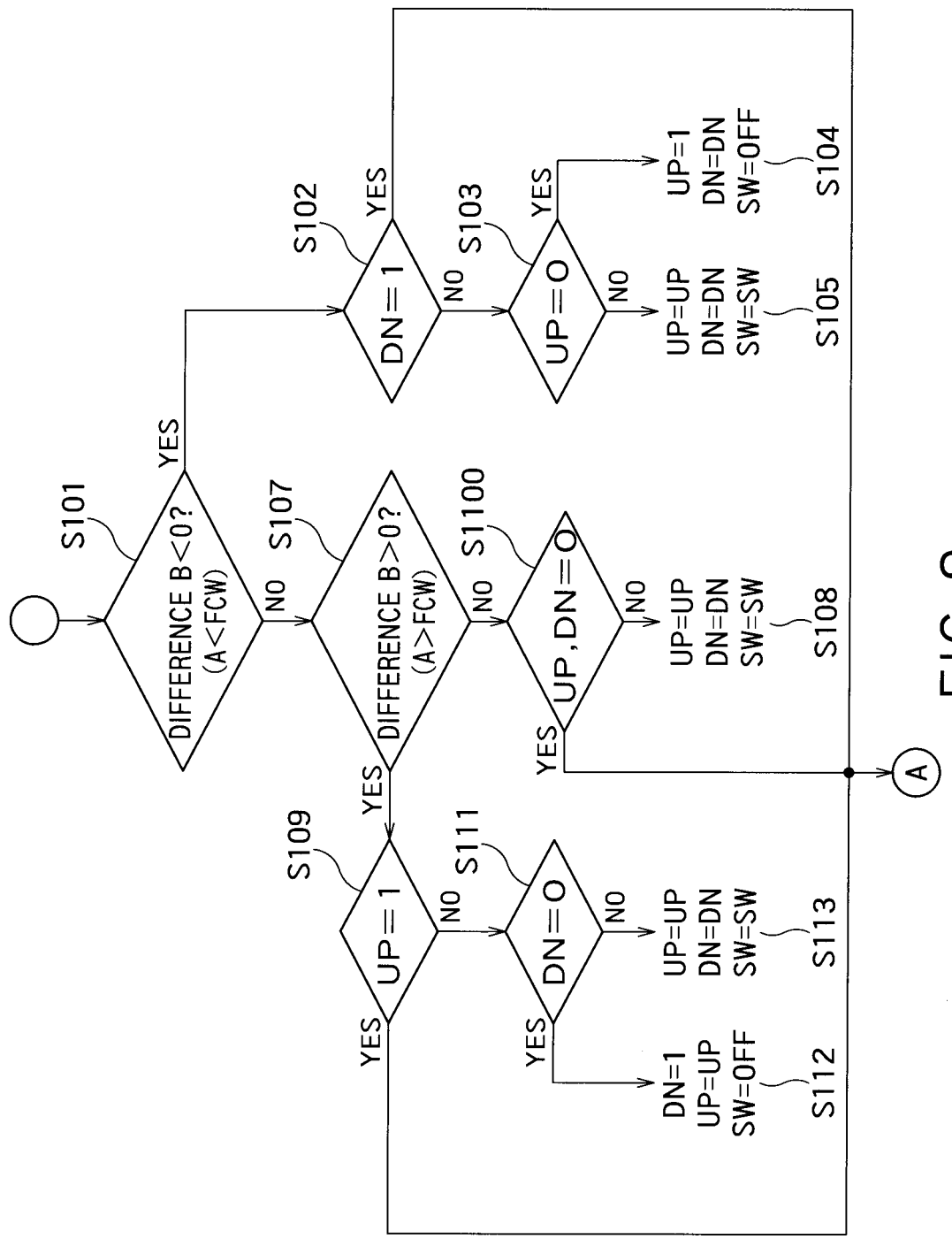
FIG. 9 is a flow chart showing a detailed operation of a logic circuit according to the second embodiment.
Figure 10:
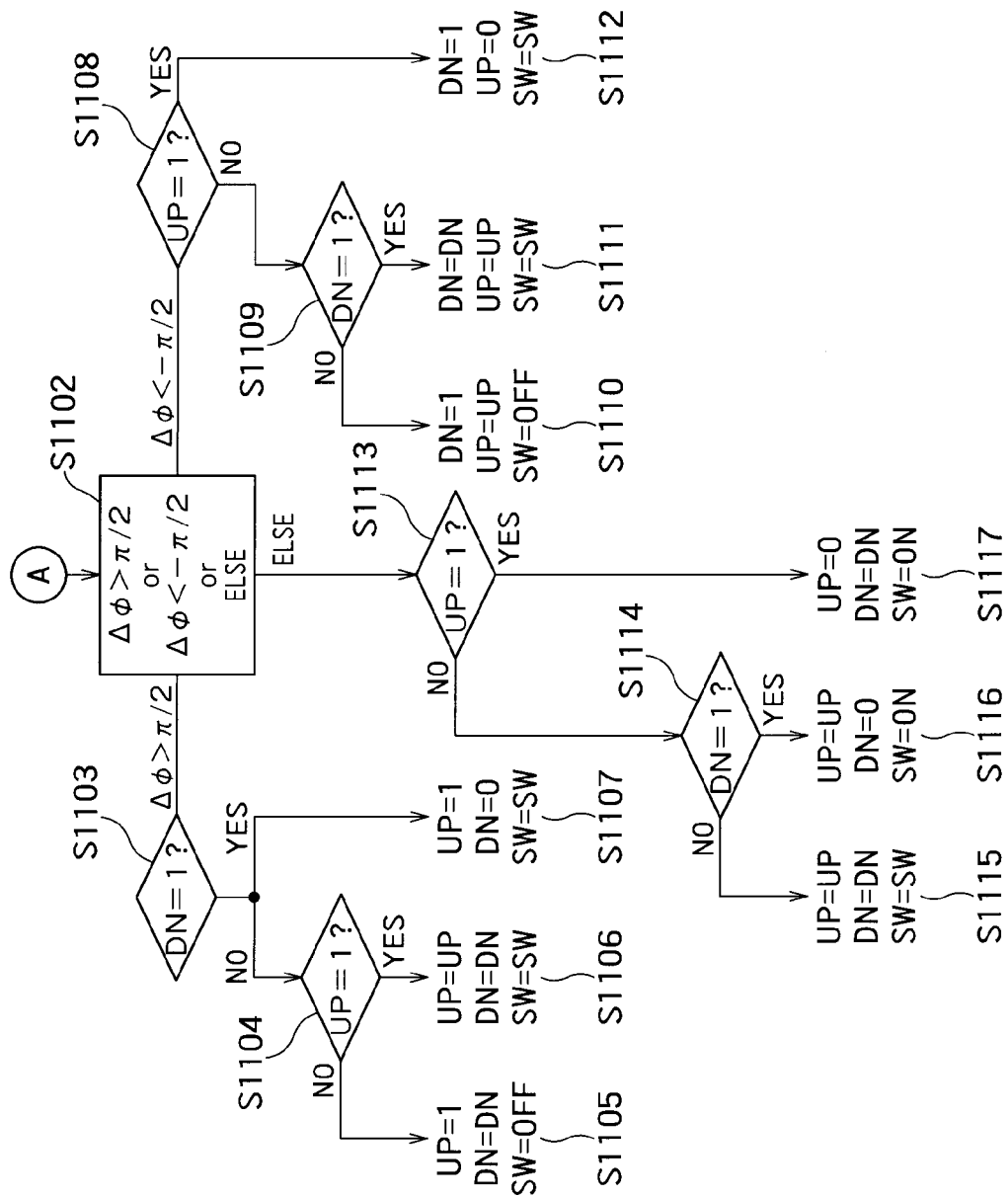
FIG. 10 is a flow chart following FIG. 9.

FIG. 9 and FIG. 10 are flow charts showing a detailed operation of the logic circuit 264 in the present embodiment.

These flow chart are provided by partially changing the flow of FIG. 4. Concretely expanded is the process performed when the phase difference is judged as $-\pi\leq\Delta\phi\leq\pi$ (SW=ON) in the flow of FIG. 4. The same steps as those of FIG. 4 are given the same symbols, and overlapping explanation will be omitted.

In FIG. 9, in the case of NO at step S107, whether UP is 0 and DN is 0 (that is, SW=ON) is examined (S1100). If not UP is 0 and DN is 0 (that is, SW=ON), the flow proceeds to step S108 similarly to the first embodiment. When UP is 0 and DN is 0 (that is, SW=ON), the flow proceeds to step S1102 in FIG. 10.

Similarly, in the cases of YES at step S109 and YES at step S102, the flow proceeds to step S1102 in FIG. 10. As will be understood from FIG. 4, YES at step S109 and YES at step S102 correspond to the case where SW is ON, that is, the case of $-\pi\Delta\phi\leq\pi$.

As stated above, in the case of $-\pi\leq\Delta\phi\leq\pi$, the flow proceeds to step S1102.

In step S1102 of FIG. 10, whether the phase difference is $\Delta\phi>\pi/2$, $\Delta\phi<-\pi/2$, or another $(-\pi/2\leq\Delta\phi\leq\pi/2)$ is judged.

In the case of $\Delta\phi>\pi/2$, control is performed so that UP is 1, DN is 0, and SW is OFF.

More specifically, whether DN is 1 is examined (S1103), and when DN is 1, control is performed so that UP is 1, DN is 0, and SW is SW (S1107).

When DN is not 1, whether UP is 1 is examined (S1104), and when UP is 1, control is performed so that UP is UP, DN is DN, and SW is SW (S1106).

When UP is not 1, control is performed so that UP is 1, DN is DN, and SW is OFF (S1105).

In the case of $\Delta\phi<-\pi/2$ at step S1102, control is performed so that DN is 1, UP is 0, and SW is OFF.

More specifically, whether UP is 1 is examined (S1108), and when UP is 1, control is performed so that DN is 1, UP is 0, and SW is SW (S1112).

When UP is not 1, whether DN is 1 is examined (S1109), and when DN is 1, control is performed so that DN is DN, UP is UP, and SW is SW (S1111).

When DN is not 1, control is performed so that DN is 1, UP is UP, and SW is OFF (S1110).

In step S1102, in the case of another case $(-\pi/2\leq\Delta\phi\leq\pi/2)$, control is performed so that UP is 0, DN is 0, and SW is ON.

More specifically, whether UP is 1 is examined (S1113), and when UP is 1, control is performed so that UP is 0, DN is DN, and SW is SW (S1117).

When UP is not 1, whether DN is 1 is examined (S1114), and when DN is 1, control is performed so that UP is UP, DN is DN, and SW is ON (S1116).

When DN is not 1, control is performed so that DN is DN, UP is UP, and SW is SW (S1115).

Steps S1105, 1106, and 1107 correspond to the case where the charge pump 170 is controlled in the first state and the switch 140 is controlled in OFF state.

Steps S1110, 1111, 1112 correspond to the case where the charge pump 170 is controlled in the second state and the switch 140 is controlled in OFF state.

Steps S1115, 1116, and 1117 correspond to the case where the charge pump 170 is controlled in the third state and the switch 140 is controlled in ON state.

In the above operation, the UP signal and the DN signal do not become 1 at the same time, and thus malfunction of the charge pump 170 can be prevented.

FIG. 8 shows phase difference—current characteristics in the present embodiment.

After the phase difference $\Delta\phi$ becomes greater than $\pi/2$, the current value is increased and kept at the value when $\Delta\phi$ is $\pi/2$, and reduction in current is stopped.

Further, after the phase difference $\Delta\phi$ becomes smaller than $-\pi/2$, the current value is reduced and kept at the value when $\Delta\phi$ is $-\pi/2$, and increase in current is stopped.

In the present embodiment, the first up or down current signal is generated when the phase difference $\Delta\phi$ is detected as being greater than $+\pi/2$ or smaller than $-\pi/2$. However, as stated above, it is also possible to generate the up or down current signal when the phase difference $\Delta\phi$ is detected as being equal to or greater than $+\pi/2$ or equal to or smaller than $-\pi/2$. The same can be applied to the embodiments which will be explained below.

As stated above, in the present embodiment, the current value when the phase difference is in the range of $\Delta\phi>\pi/2$ or $\Delta\phi<-\pi/2$ can be set more appropriately compared to the first embodiment, and thus lockup control can be performed at higher speed.

Third Embodiment

Figure 11:
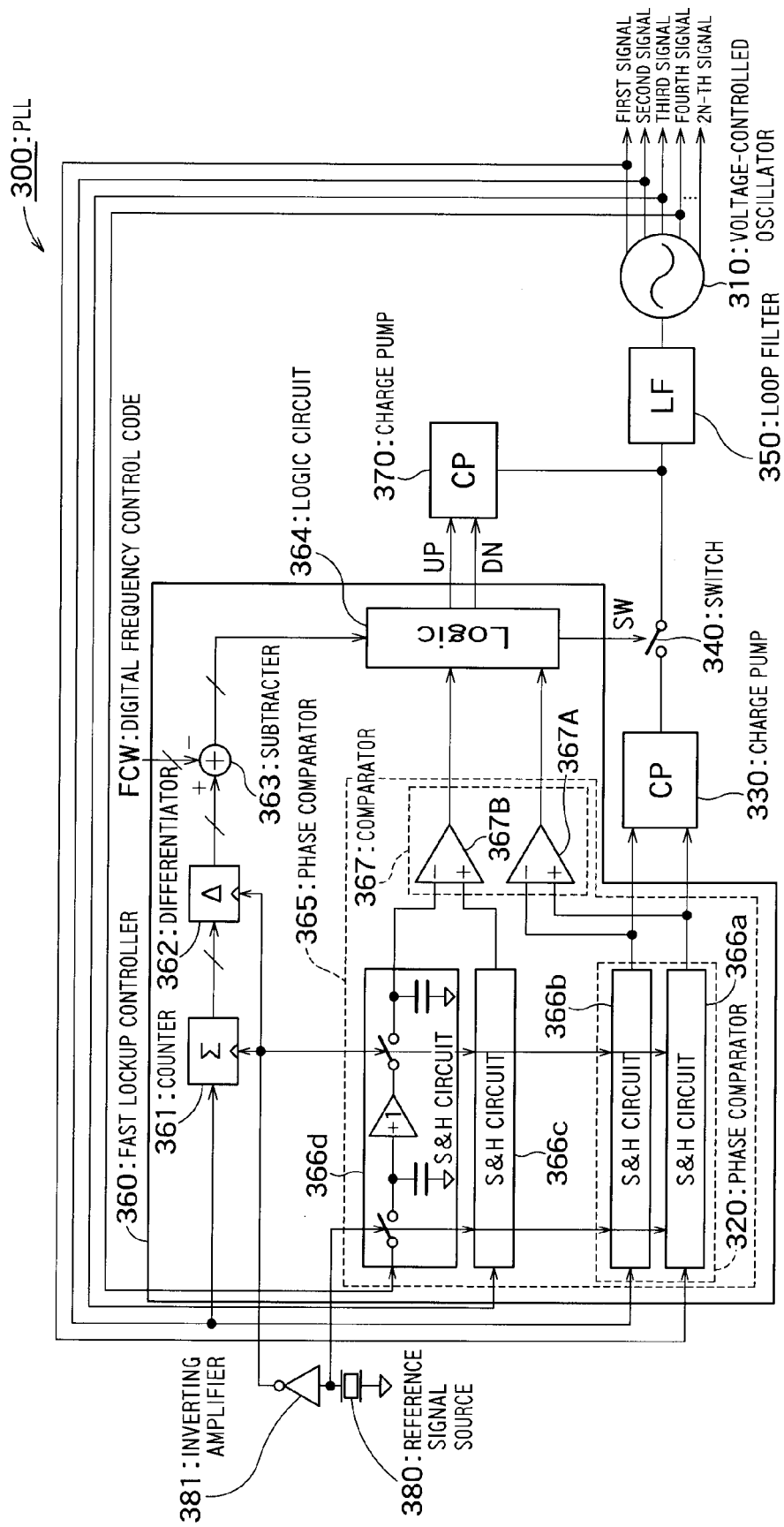
FIG. 11 shows the structure of a phase-locked loop circuit according to a third embodiment.

FIG. 11 shows the structure of a PLL 300 according to the third embodiment. Hereinafter, differences from the second embodiment will be mainly explained, and explanation overlapping with the second embodiment will be omitted.

The PLL 300 includes: a voltage-controlled oscillator 310; a charge pump 330; a charge pump 370; a switch 340; a loop filter 350; a fast lockup controller 360; a reference signal source 380; and an inverting amplifier 381.

The voltage-controlled oscillator 310, the charge pump 330, the charge pump 370, the switch 340, the loop filter 350, the reference signal source 380 function similarly to the voltage-controlled oscillator 210, the charge pump 230, the charge pump 270, the switch 240, the loop filter 250, and the reference signal source 280 of the second embodiment, respectively.

The inverting amplifier 381 reverses the reference signal generated by the reference signal source 380, and outputs the reversed reference signal to a counter 361 and a differentiator 362. Further, the inverting amplifier 381 outputs the reversed reference signal to the switches in sample-and-hold circuits 366a to 366d, which will be explained later.

The fast lockup controller 360 includes: the counter 361; the differentiator 362; a subtracter 363; a logic circuit 364; and a phase comparator 365.

The counter 361, the differentiator 362, and the subtracter 363 function similarly to the counter 261, the differentiator 262, and the subtracter 263 in the second embodiment. Differently from the second embodiment, the counter 361 and the differentiator 362 operate at the rising edge of the reversal reference signal, that is, at the falling edge of the reference signal.

Since the sample-and-hold circuits 366a, 366b, 366c, and 366d are configured to synchronize with the falling edge of the reference signal, the counter 361 and the differentiator 362 are correspondingly configured to synchronize with the falling edge. Note that, in FIG. 5 used in the first embodiment, the voltage-controlled oscillator synchronizes with the reference signal at the rising edge of the reference signal.

The phase comparator 365 includes sample-and-hold circuits 366a, 366b, 366c, and 366d and comparators 367 (367A and 367B).

The sample-and-hold circuit 366a includes a former switch, a buffer, a latter switch, and a capacitor. The sample-and-hold circuits 366b to 366d are formed similarly to the sample-and-hold circuit 366a.

The sample-and-hold circuits 366a to 366d are inputted with the first signal to the fourth signal respectively. Further, the former switches of the sample-and-hold circuits 366a to 366d are inputted with the reference signal, and the latter switches of the sample-and-hold circuits 366a to 366d are inputted with the reversal reference signal, as stated above.

The former switch of each sample-and-hold circuit is turned on while the reference signal is High and turned off while the reference signal is Low.

The latter switch of each sample-and-hold circuit is turned on while the reversal reference signal is High and turned off while the reversal reference signal is Low.

By alternately turning on and off the former switch and the latter switch, sampling and hold operation is performed on the correspond signal.

In the sample-and-hold circuits 366a to 366d, the sample-and-hold circuits 366a and 366b form a phase comparator 320 for detecting the phase difference $\Delta\phi$ between the reference signal and the first signal.

The phase comparator 320 outputs a signal depending on the detected phase difference $\Delta\phi$ to the charge pump 330. A detailed operation of the phase comparator 320 will be explained later.

The sample-and-hold circuits 366a to 366d sample the first signal, the second signal, the third signal, and the fourth signal respectively in each cycle of the reference signal), and retain and output the sampled voltages. The sampling is performed with the voltage at the falling edge of the reference signal.

The comparator 367A compares the sampled voltages of the first signal and the second signal with each other, and outputs the magnitude relation. The comparator 367B compares the sampled voltages of the third signal and the fourth signal with each other, and outputs the magnitude relation.

In more detail, the comparator 367A outputs 1 when the sampled voltage of the first signal is high, and outputs 0 when the sampled voltage of the second signal is high.

The comparator 367B outputs 1 when the sampled voltage of the third signal is high, and outputs 0 when the sampled voltage of the fourth signal is high.

Figure 12:
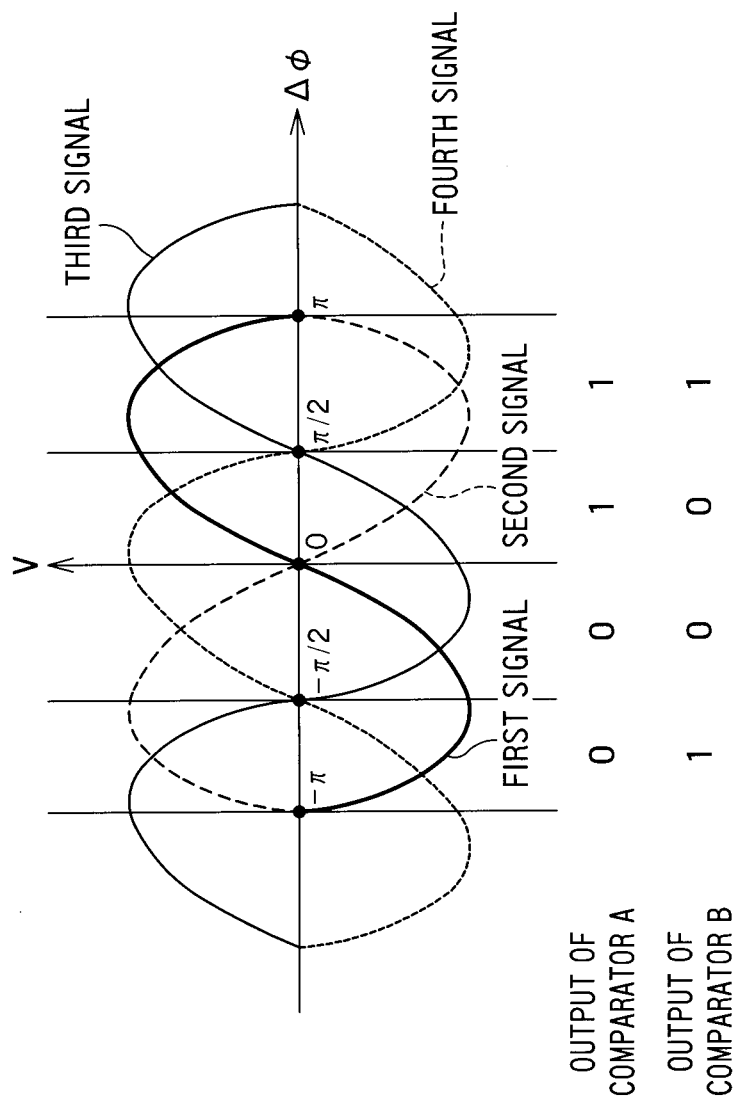
FIG. 12 shows the relationship among the phase difference between each signal and the reference signal, sampled voltage of each signal, and comparator output.

FIG. 12 shows the sampled voltages of the first signal, the second signal, the third signal, and the fourth signals and the outputs of the comparators 367A and 367B when the phase difference $\Delta\phi$ is generated between the reference signal and the first signal.

As stated above, by using the sampled voltages of the first signal, the second signal, the third signal, and the fourth signal, the phase difference $\Delta\phi$ can be detected with a resolution of $\pi/2$ in the range of $-\pi \leq \Delta\phi \leq +\pi$.

Accordingly, by using the outputs of the comparators 367A and 367B, it is possible judge whether the phase difference $\Delta\phi$ is greater than $\pi/2$ or smaller than $-\pi/2$ in the range of $-\pi \leq \Delta\phi \leq +\pi$.

The logic circuit 364 controls the UP signal, the DN signal, and the SW signal based on the outputs of the comparators 367A and 367B and the differential value B outputted from the subtracter 363. This operation may be performed similarly to the second embodiment, in accordance with the process in the flow charts of FIG. 9 and FIG. 10.

In this case, in step S1102 of FIG. 10, which one of the above intervals (1) to (4) is applicable to the phase difference $\Delta\phi$ is judge based on the outputs of the comparators 367A and 367B.

That is, when the outputs of the comparators 367A and 367B are "0" and "1" respectively, the interval (1) is determined as shown in FIG. 12. Similarly, the interval (2) is determined when the outputs of the comparators 367A and 367B are "0" and "0" respectively, the interval (3) is determined when the outputs are "1" and "0," and the interval (4) is determined when the outputs are "1" and "1."

Similarly to the second embodiment, phase-current characteristics of the PLL 300 in the present embodiment is as shown in FIG. 8.

Accordingly, in the present embodiment, the current value when the phase difference is in the range of $\Delta\phi>\pi/2$ or $\Delta\phi<-\pi/2$ can be set more appropriately compared to the first embodiment, and thus lockup control can be performed at higher speed.

Figure 13:
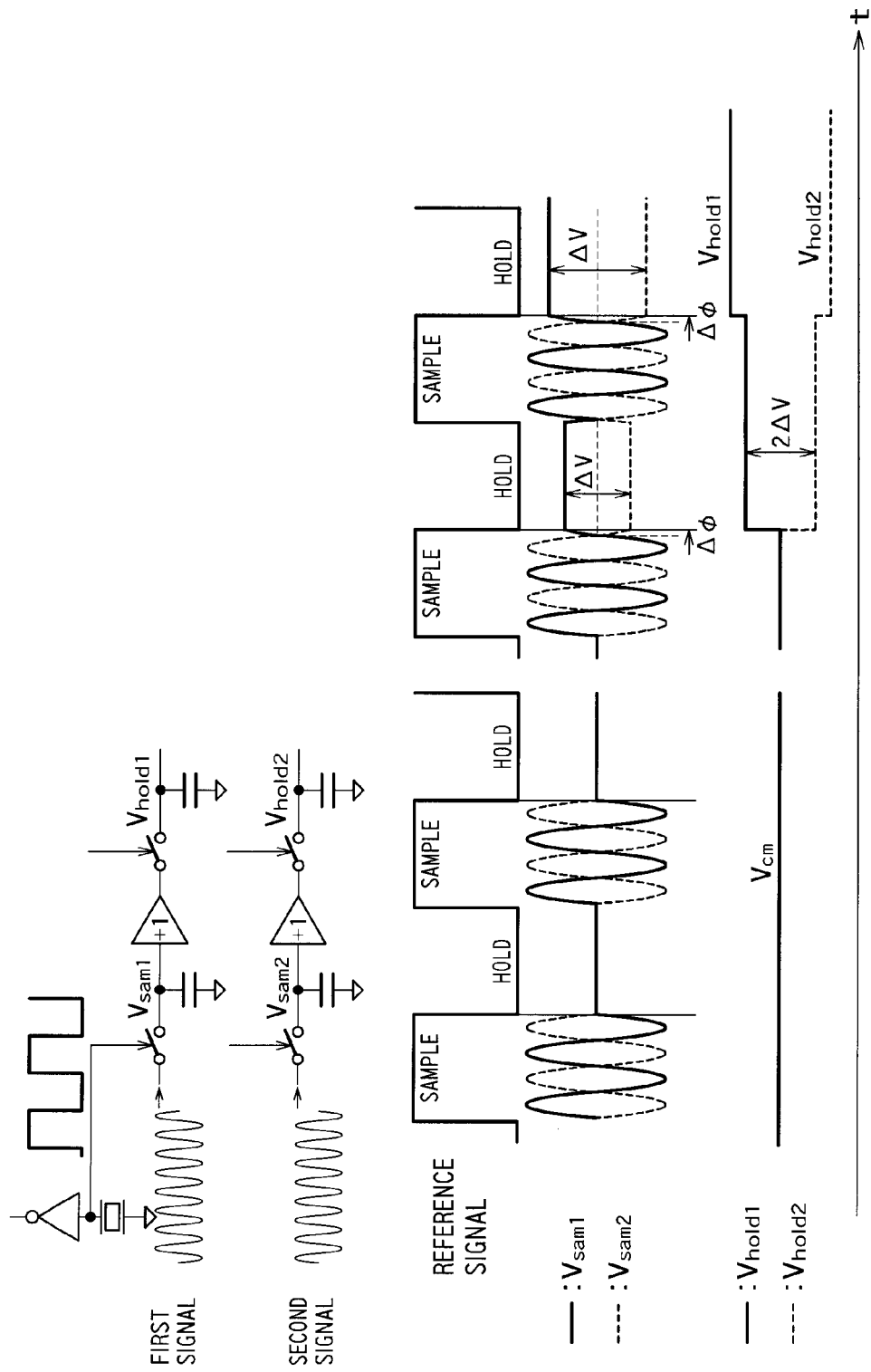
FIG. 13 is a diagram to explain the operation of a phase comparator formed of two sample-and-hold circuits.
Figure 14:
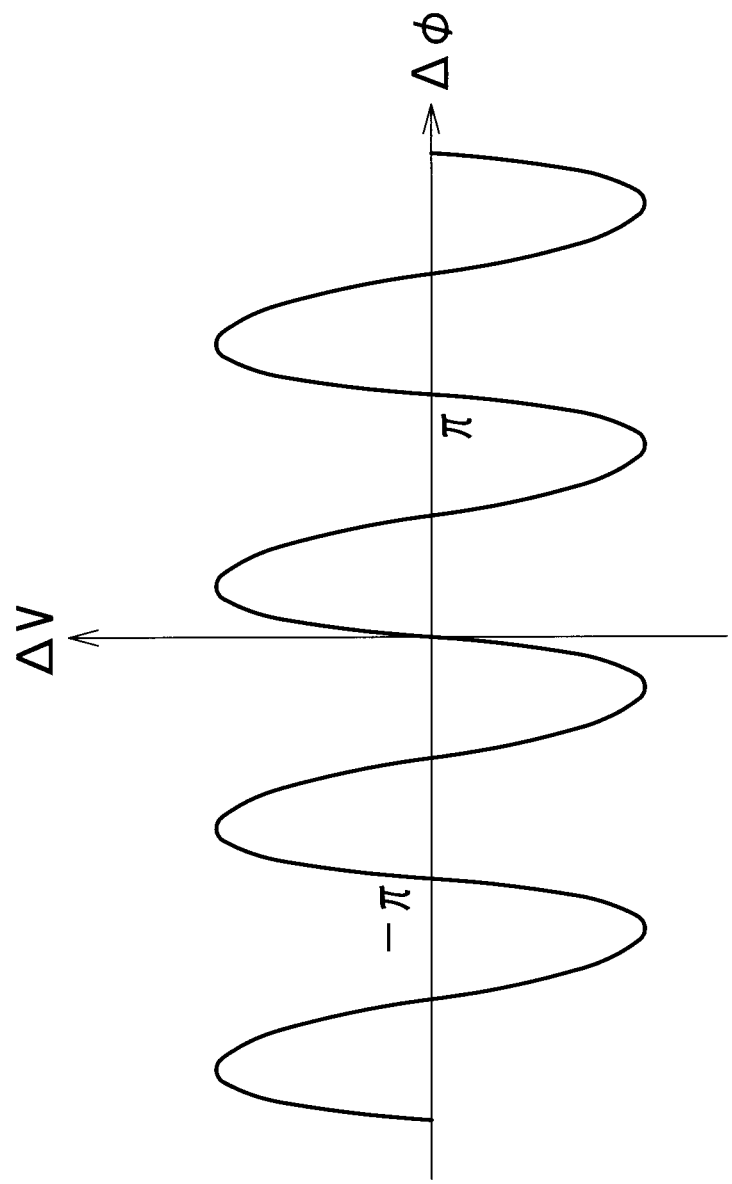
FIG. 14 shows the relationship between the sampled voltage and phase difference.

FIG. 13 and FIG. 14 are diagrams to explain the operation of the phase comparator 320 including the sample-and-hold circuits 366a and 366b.

Voltage on the input side of the buffer (voltage to be sampled) of the sample-and-hold circuit 366a inputted with the first signal is defined as Vsam 1, and voltage to be retained is defined as Vhold 1. Similarly, voltage on the input side of the buffer (voltage to be sampled) of the sample-and-hold circuit 366b inputted with the second signal is defined as Vsam 2, and voltage to be retained is defined as Vhold 2.

Each of the sample-and-hold circuits 366a and 366b samples and retains the voltage at the falling edge when the reference signal changes from 1 to 0. That is, voltages Vhold 1 and Vhold 2 change at the falling edge of the reference signal.

When the phase difference $\Delta\phi$ is 0, that is, when the first signal and the reference signal synchronize with each other, the voltages Vhold 1 and Vhold 2 are constantly outputted as constant voltage Vcm.

When $\Delta\phi \neq 0$, the voltages held by the sample-and-hold circuits 366a and 366b become Vcm+$\Delta$V and Vcm-$\Delta$V respectively depending on the phase difference $\Delta\phi$.

FIG. 14 shows the relationship between the phase difference $\Delta\phi$ and the voltage difference $\Delta$V. These two voltages, Vcm+$\Delta$V and Vcm-$\Delta$V, are outputted to the charge pump 330.

The charge pump 330 obtains the difference between these two voltages to detect the voltage (=2×$\Delta$V) depending on the phase difference $\Delta\phi$. The charge pump 330 generates a current signal based on the detected voltage.

As stated above, in the present embodiment, when the phase difference $\Delta\phi$ is detected as being greater than +$\pi/2$ or smaller than -$\pi/2$, the switch 340 is turned off and up or the down current signal is supplied to the loop filter, and thus lockup control can be performed at higher speed compared to the first embodiment.

Fourth Embodiment

Figure 15:
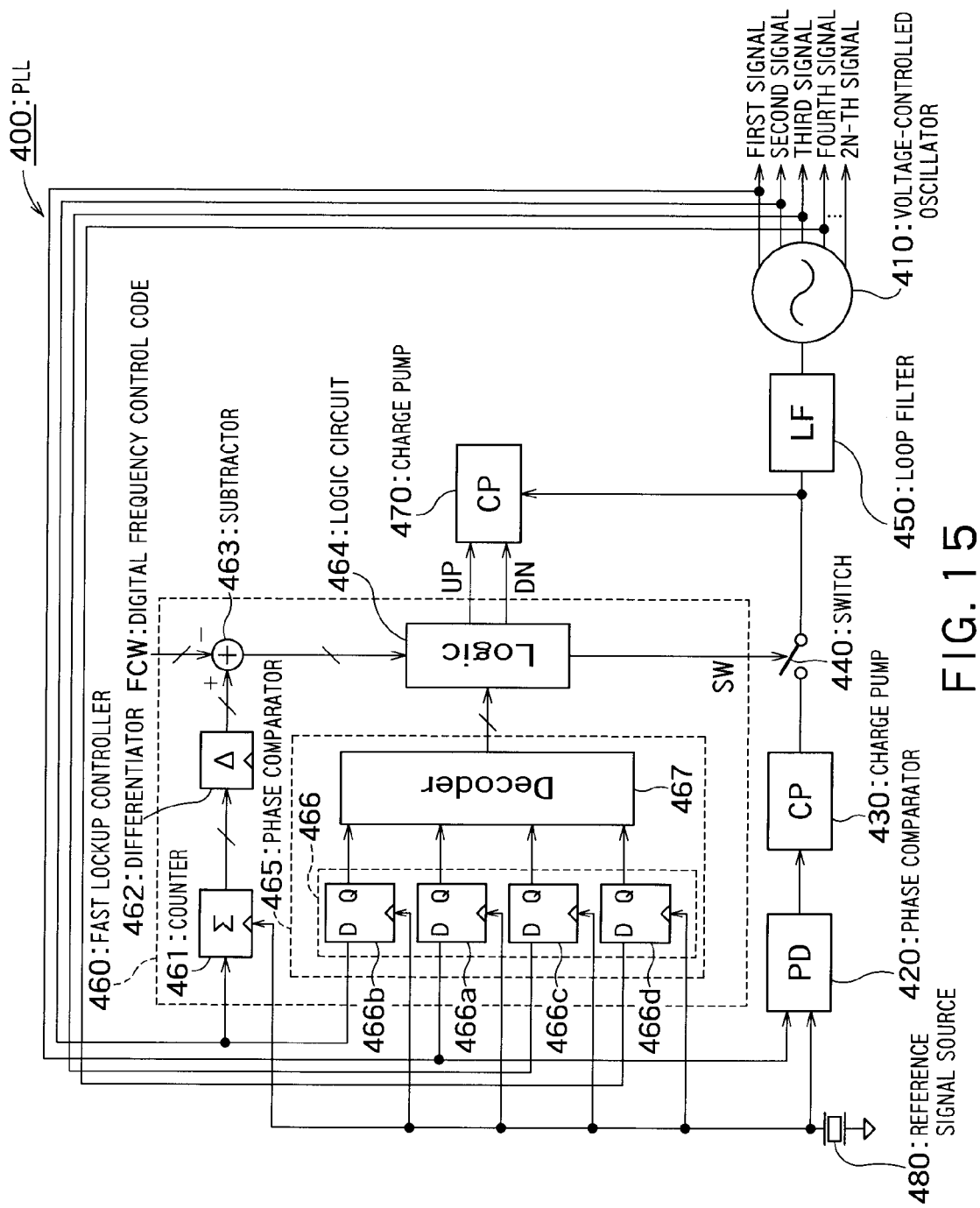
FIG. 15 shows the structure of a phase-locked loop circuit according to a fourth embodiment.

FIG. 15 shows the structure of a PLL 400 according to a fourth embodiment. Hereinafter, differences from the second or third embodiment will be mainly explained, and explanation overlapping with the second or third embodiment will be omitted.

The PLL 400 includes: a voltage-controlled oscillator 410; a phase comparator 420; a charge pump 430; a charge pump 470; a switch 440; a loop filter 450; a fast lockup controller 460; and a reference signal source 480.

The voltage-controlled oscillator 410, the phase comparator 420, the charge pump 430, the charge pump 470, the switch 440, the switch 440, the loop filter 450, and the reference signal source 480 function similarly to the voltage-controlled oscillator 210, the phase comparator 220, the charge pump 230, the charge pump 270, the switch 240, the switch 240, the loop filter 250, and the reference signal source 280 in the second embodiment respectively.

The fast lockup controller 460 includes: a counter 461; a differentiator 462; a subtracter 463; a logic circuit 464; and a phase comparator 465.

The counter 461, the differentiator 462, and the subtracter 463 function similarly to the counter 261, the differentiator 262, and the subtracter 263 in the second embodiment respectively.

The phase comparator 465 includes D flip-flops (DFF) 466a to 466d and a decoder 467.

The D flip-flop 466a is inputted with the first signal and the reference signal.

The D flip-flop 466b is inputted with the second signal and the reference signal.

The D flip-flop 466c is inputted with the third signal and the reference signal.

The D flip-flop 466d is inputted with the fourth signal and the reference signal.

The D flip-flops 466a to 466d output values depending on the voltages of the first to the fourth signals at the rising edge of the reference signal in each cycle of the reference signal.

More specifically, the D flip-flops 466a to 466d output the bit of 1 when the voltages of the first to fourth signals are positive, and output the bit of 0 when the voltages of the first to fourth signals are or negative.

Figure 16:
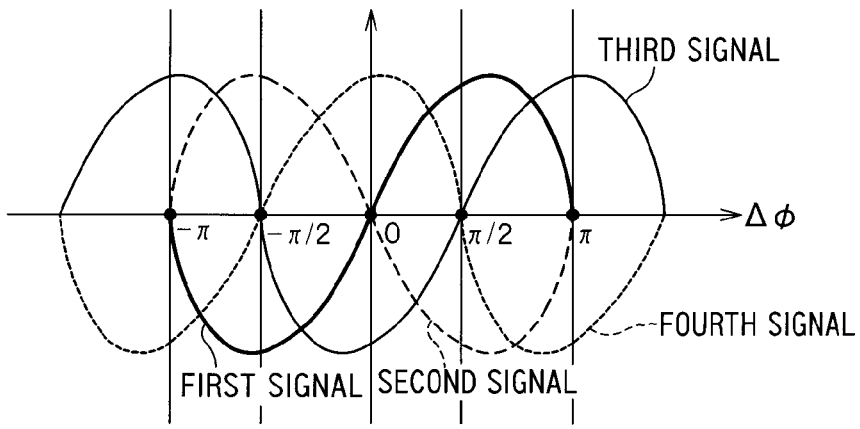
FIG. 16 shows the output from a D flip-flop depending on the phase difference between each signal and the reference signal.

FIG. 16 shows the outputs of the D flip-flops 466a to 466d when the phase difference Δφ between the reference signal and the first signal changes.

The D flip-flop 466a, which corresponds to the first signal, outputs: 0 when the phase difference Δφ is equal to or greater than $-\pi$ and smaller than $-\pi/2$; 0 when the phase difference Δφ is equal to or greater than $-\pi/2$ and equal to or smaller than 0; 1 when the phase difference Δφ is greater than 0 and equal to or smaller than $\pi/2$; and 1 when the phase difference is greater than $\pi/2$.

The D flip-flops 466b to 466d, which correspond to the second to fourth signals respectively, similarly output values in accordance with the relationship in FIG. 16.

The decoder 467 converts the 4 bit output signals outputted from the D flip-flops 466a to 466d into 2-bit data.

That is, as will be understood from FIG. 16, there are four output patterns with respect to the D flip-flops 466a to 466d. Therefore, these four patterns can be expressed as binary data ("11," "10," "01," "00"). The decoder 467 outputs the converted 2-bit data to the logic circuit 464.

Similarly to the third embodiment, the logic circuit 464 generates the UP signal, the DN signal, and the SW signal based on the differential value B outputted from the subtracter 463 and the output (2-bit data) of the phase comparator 465. In this way, the charge pump 470 and the switch 440 are controlled.

Similarly to the second or the third embodiment, the logic circuit 464 performs the operation based on the flow shown in FIG. 9 and FIG. 10. The logic circuit 464 retains correspondence information between "11," "10," "01," "00," each of which can be expressed as 2-bit data, and the four intervals (1) to (4) obtained by dividing the range of $-\pi \leq \Delta\phi \leq \pi$ by $\pi/2$.

Based on this information, the logic circuit 464 acquires the phase difference Δφ within the range of $-\pi \leq \Delta\phi \leq \pi$ with a resolution of $\pi/2$, and performs the operation of FIG. 10.

Similarly to the second embodiment, phase-current characteristics in the present embodiment is as shown in FIG. 8.

As stated above, in the present embodiment, when the phase difference Δφ is detected as being greater than $+\pi/2$ or smaller than $-\pi/2$, the switch 440 is turned off and up or the down current signal is supplied to the loop filter, and thus lockup control can be performed at higher speed compared to the first embodiment.

Fifth Embodiment

Figure 17:
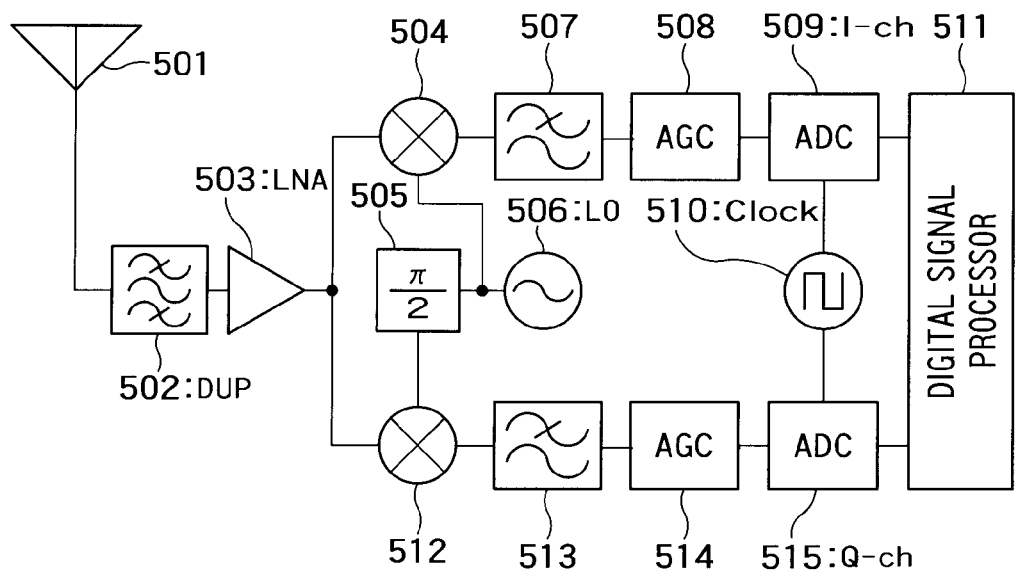
FIG. 17 shows the structure of a receiver according to a fifth embodiment.

FIG. 17 shows the structure of a receiver according to a fifth embodiment.

This receiver includes: a antenna 501; a duplexer (DUP) 502; a low noise amplifier (LNA) 503; a local oscillator 506; a $\pi/2(90°)$ phase shifter 505; a digital signal processor 511; a mixer 504; a low pass filter (LPF) 507; an automatic gain control (AGC) 508; an analog-digital converter (ADC) 509; a mixer 512; an LPF 513; an AGC 514; an ADC 515; and a clock generating circuit 510. Each of the mixers 504 and 512 is a quadrature demodulator.

The antenna 501 receives a radio frequency (RF) signal and inputs the RF signal into the duplexer 502.

The duplexer 502 removes unnecessary waves from the RF signal and transmits it to the LNA 503.

The LNA 503 amplifies the RF signal from the duplexer 502, and inputs it into the mixer 504 and the mixer 512.

The local oscillator 506 generates a local signal for down-converting the RF signal, and inputs the local signal into the mixer 504 and the 90° phase shifter 505.

The 90° phase shifter 505 shifts the phase of the local signal from the local oscillator 506 by 90°), and inputs it into the mixer 512.

The mixer 504 multiplies the RF signal from the LNA 503 and the local signal from the local oscillator 506 to generate an I signal.

The mixer 512 multiplies the RF signal and the local signal whose phase is shifted by the 90° phase shifter 505 to generate a Q signal.

The mixers 504 and 512, the 90° phase shifter 505, and the local oscillator 506 form a RF unit.

The LPFs 507 and 513 remove high frequency components from the I signal generated by the mixer 504 and from the Q signal generated by the mixer 512, respectively.

The AGCs 508 and 514 adjust the levels of signals passed through the LPFs 507 and 513 respectively.

The clock generating circuit 510 is formed of a phase-locked loop circuit according to any one of the above first to fourth embodiments.

The clock generating circuit 510 generates sampling clocks used by the ADCs 509 and 515.

The sampling clock is one of the first to fourth signals generated by the voltage-controlled oscillator of the phase-locked loop circuit. For example, the sampling clock is the first signal.

The ADCs 509 and 515 sample the I signal and the Q signal depending on the sampling clocks generated by the clock generating circuit 510 to convert the signals into digital data, and input the digital data into the digital signal processor 511.

The digital signal processor 511 is formed of a digital signal processor (DSP), for example. The digital signal processor 511 processes the digital I and Q signals from the ADCs 509 and 515 to decode and reproduce the data.

As stated above, according to the present embodiment, the clock generating circuit for generating the sampling clocks of the ADCs converting the I signal and the Q signal is formed by using the phase-locked loop circuit of any one of the first to fourth embodiments. Therefore, the clock generating circuit is smaller in size and consumes lower power compared to the conventional circuit, and can generation a high-accuracy and low-jitter sampling clock.

Embodiments of the present invention is not limited to the exact embodiments described above and can be embodied with its components modified in an implementation phase without departing from the scope of the invention. Also, arbitrary combinations of the components disclosed in the above-described embodiments can form various inventions. For example, some of the all components shown in the embodiments may be omitted. Furthermore, components from different embodiments may be combined as appropriate.

The invention claimed is:

1. A phase-locked loop circuit for obtaining an output signal having an output frequency obtained by multiplying a frequency of a reference signal by an arbitrary integer X of 1 or greater and having a phase synchronized with that of the reference signal, comprising:
    a reference signal source configured to generate the reference signal having cycles;
    a voltage-controlled oscillator configured to generate a first signal and a second signal having a phase reverse to that of the first signal, frequencies of the first signal and the second signal being controlled depending on a control voltage;
    a phase comparator configured to acquire a first sampled voltage by sampling a voltage of the first signal in each cycle of the reference signal;
    a first charge pump configured to generate a current signal depending on the first sampled voltage;
    a loop filter configured to generate the control voltage to be supplied to the voltage-controlled oscillator by smoothing the current signal;
    a switch configured to have an ON state and an OFF state and supply the current signal generated by the first charge pump to the loop filter in the ON state and to block the supply of the current signal to the loop filter in the OFF state;
    a counter configured to count a cycle number of the second signal included in one cycle period of the reference signal;
    a second charge pump configured to supply, to the loop filter, a first current signal having a constant value and a second current signal having a constant value whose polarity is reverse to that of the first current signal, and selectively has any one of a first state for supplying only the first current signal, a second state for supplying only the second current signal, and a third state for not supplying either of the first current signal and the second current signal; and
    a control circuit configured to control the switch and the second charge pump based on a comparison between the cycle number of the second signal counted by the counter and the value X.

2. The circuit of claim 1, wherein
    (A) when the cycle number is larger than the value X and the second charge pump is in the first state, the control circuit controls the second charge pump in the third state and controls the switch in the ON state,
    (B) when the cycle number is larger than the value X and the second charge pump is in the second state, the control circuit controls the second charge pump in the second state and controls the switch in the OFF state,
    (C) when the cycle number is larger than the value X and the second charge pump is in the third state, the control circuit controls the second charge pump in the second state and controls the switch in the OFF state,
    (D) when the cycle number is smaller than the value X and the second charge pump is in the first state, the control circuit controls the second charge pump in the first state and controls the switch in the OFF state,
    (E) when the cycle number is smaller than the value X and the second charge pump is in the second state, the control circuit controls the second charge pump in the third state and controls the switch in the ON state,
    (F) when the cycle number is smaller than the value X and the second charge pump is in the third state, the control circuit controls the second charge pump in the first state and controls the switch in the OFF state,
    (G) when the cycle number is equal to the value X and the second charge pump is in the first state, the control circuit controls the second charge pump in the first state and controls the switch in the OFF state,
    (H) when the cycle number is equal to the value X and the second charge pump is in the second state, the control circuit controls the second charge pump in the second state and controls the switch in the OFF state, and
    (I) when the cycle number is equal to the value X and the second charge pump in the third state, the control circuit controls the second charge pump in the third state and controls the switch in the ON state.

3. The circuit of claim 2, wherein
    the voltage-controlled oscillator further generates a third signal having a phase delayed from that of the first signal by $\pi/2$ and a fourth signal having a phase delayed from that of the second signal by $\pi/2$, and
    the control circuit samples voltages of the first signal, the second signal, the third signal, and the fourth signal, and determines that a phase difference between the first signal and the reference signal belongs to any one of a first interval, a second interval and a third interval, based on a magnitude relation between sampled voltages of the first and second signals and a magnitude relation between sampled voltages of the third and fourth signals,
    the first interval in which the phase of the first signal is advanced from that of the reference signal by a phase difference which is equal to or greater than $\pi/2$ and equal to or smaller than $\pi$;
    the second interval in which the phase of the first signal is delayed from that of the reference signal by a phase difference which is equal to or greater than $\pi/2$ and equal to or smaller than $\pi$; and
    the third interval in which the phase of the first signal is delayed from that of the reference signal by a phase difference which is equal to or greater than 0 and equal to or smaller than $\pi/2$ or the phase of the first signal is advanced from that of the reference signal by a phase difference which is equal to or greater than 0 and equal to or smaller than $\pi/2$, wherein when the cycle number and the state of the second charge pump are satisfactory for any one of the conditions (A), (E), and (I) and the phase difference belongs to the first interval, the control circuit controls the second charge pump in the second state and controls the switch in the OFF state, when the cycle number and the state of the second charge pump are satisfactory for any one of the conditions (A), (E), and (I) and the phase difference belongs to the second interval, the control circuit controls the second charge pump in the first state and controls the switch in the OFF state, and when the cycle number and the state of the second charge pump are satisfactory for any one of the conditions (A), (E), and (I) and the phase difference belongs to the third interval, the control circuit controls the second charge pump in the third state and controls the switch in the ON state.

4. The circuit of claim 3, wherein the control circuit uses polarities of the sampled voltages of the first to fourth signals instead of the magnitude relation between the sampled voltages of the first and second signals and the magnitude relation between the sampled voltages of the third and fourth signals.

5. A radio receiver comprising:
an antenna configured to receive a high-frequency signal to generate an analog received signal;
an RF unit configured to generate a baseband signal by down-converting the analog received signal;
a clock generating circuit configured to generate clocks;
an analog-digital converter configured to perform an analog/digital conversion process by using the clock generated by the clock generating circuit to convert the baseband signal into a digital signal; and
a data signal processor configured to reproduce data by performing digital signal processing on the digital signal,
wherein the clock generating circuit is the phase-locked loop circuit of claim 1.

* * * * *